United States Patent
Hartley

(10) Patent No.: US 11,621,144 B2
(45) Date of Patent: Apr. 4, 2023

(54) ELECTRON OPTICAL SYSTEM AND MULTI-BEAM IMAGE ACQUIRING APPARATUS

(71) Applicants: NuFlare Technology, Inc., Yokohama (JP); NuFlare Technology America, Inc., Sunnyvale, CA (US)

(72) Inventor: John Hartley, Stormville, NY (US)

(73) Assignees: NuFlare Technology, Inc., Yokohama (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 16/525,792

(22) Filed: Jul. 30, 2019

(65) Prior Publication Data
US 2020/0043698 A1 Feb. 6, 2020

Related U.S. Application Data

(60) Provisional application No. 62/714,245, filed on Aug. 3, 2018.

(51) Int. Cl.
*H01J 37/22* (2006.01)
*G06T 7/00* (2017.01)
(Continued)

(52) U.S. Cl.
CPC ........ *H01J 37/222* (2013.01); *G01N 21/9501* (2013.01); *G01N 21/95607* (2013.01); *G06T 7/001* (2013.01); *H01J 37/045* (2013.01); *H01J 37/05* (2013.01); *H01J 37/09* (2013.01); *H01J 37/141* (2013.01); *H01J 37/244* (2013.01);
(Continued)

(58) Field of Classification Search
CPC .... G01N 21/9501; H01J 37/05; H01J 37/141; H01J 37/28; H01J 37/09; H01J 2237/1415; H01J 37/222; H01J 37/244; H01J 37/045; H01J 35/153; H01J 2237/24592
See application file for complete search history.

(56) References Cited

U.S. PATENT DOCUMENTS 3,736,423 A * 5/1973 Katagiri ................. H01J 37/153
250/396 ML
3,984,687 A * 10/1976 Loeffler .............. H01J 37/1475
250/396 ML
(Continued)

FOREIGN PATENT DOCUMENTS

JP 6-325721 11/1994
JP 2000-173529 A 6/2000
(Continued)

OTHER PUBLICATIONS

Korean Office Action dated Aug. 12, 2020 in Patent Application No. 10-20153-0094323 (with English translation), 8 pages
(Continued)

*Primary Examiner* — Wyatt A Stoffa
(74) *Attorney, Agent, or Firm* — Oblon, McClelland, Maier & Neustadt, L.L.P.

(57) ABSTRACT

An electron optical system includes an electromagnetic lens configured to include a yoke, and refract an electron beam passing through the yoke by generating a magnetic field, and a shield coil disposed along the inner wall of the yoke, and configured to reduce a leakage magnetic field generated by the electromagnetic lens.

7 Claims, 14 Drawing Sheets

(51) Int. Cl.
  *H01L 21/67* (2006.01)
  *H01J 37/09* (2006.01)
  *H01J 37/141* (2006.01)
  *H01J 37/244* (2006.01)
  *H01J 37/04* (2006.01)
  *G01N 21/95* (2006.01)
  *G01N 21/956* (2006.01)
  *H01J 37/05* (2006.01)

(52) U.S. Cl.
  CPC ............ *H01L 21/67288* (2013.01); *G06T 2207/30148* (2013.01); *H01J 2237/24592* (2013.01)

(56) References Cited

U.S. PATENT DOCUMENTS

| | | | | |
|---|---|---|---|---|
| 4,469,948 | A * | 9/1984 | Veneklasen | H01J 37/141 250/396 ML |
| 5,847,399 | A * | 12/1998 | Schmitt | H01J 37/09 250/396 ML |
| 6,160,262 | A * | 12/2000 | Aoki | H01J 49/26 250/398 |
| 6,831,281 | B2 * | 12/2004 | Nakasuji | B82Y 10/00 250/396 ML |
| 8,592,777 | B2 * | 11/2013 | Kropp | H01J 37/1475 250/311 |
| 2002/0121615 | A1 * | 9/2002 | Nakasuji | B82Y 40/00 250/396 ML |
| 2003/0205678 | A1 * | 11/2003 | Notte, IV | B82Y 15/00 250/423 F |
| 2004/0119022 | A1 * | 6/2004 | Sato | H01J 37/153 250/396 R |
| 2004/0217304 | A1 * | 11/2004 | Veneklasen | H01J 37/141 250/398 |
| 2006/0022150 | A1 * | 2/2006 | Takeuchi | H01J 37/3056 250/492.21 |
| 2007/0138390 | A1 * | 6/2007 | Nishiyama | H01J 37/28 250/310 |
| 2007/0187598 | A1 * | 8/2007 | Tachibana | H01J 37/28 250/310 |
| 2008/0135755 | A1 * | 6/2008 | Suzuki | H01J 37/28 250/310 |
| 2009/0208091 | A1 * | 8/2009 | Hayakawa | G06T 7/001 250/306 |
| 2013/0327939 | A1 * | 12/2013 | Miya | H01L 22/10 250/442.11 |
| 2015/0014530 | A1 * | 1/2015 | Ominami | H01J 37/18 250/311 |
| 2015/0294833 | A1 * | 10/2015 | Fukuda | H01J 37/147 250/310 |
| 2017/0025241 | A1 * | 1/2017 | Li | H01J 37/28 |
| 2017/0084421 | A1 * | 3/2017 | McCord | H01J 37/045 |
| 2018/0158642 | A1 * | 6/2018 | Frosien | H01J 37/28 |
| 2019/0295808 | A1 * | 9/2019 | He | H01J 37/26 |
| 2019/0341224 | A1 * | 11/2019 | Hempenius | H01J 37/09 |
| 2020/0219697 | A1 * | 7/2020 | Hirano | H01J 37/20 |
| 2020/0251304 | A1 * | 8/2020 | Hirano | H01J 37/141 |

FOREIGN PATENT DOCUMENTS

| | | |
|---|---|---|
| JP | 2007-220399 A | 8/2007 |
| JP | 2009-194124 A | 8/2009 |
| JP | 2018-41737 A | 3/2018 |

OTHER PUBLICATIONS

Office Action dated Oct. 7, 2020 in Taiwanese Application No. 108 126 976, along with an English translation.
Combined Taiwanese Office Action and Search Report dated Mar. 10, 2021 in Taiwanese Patent Application No. 108126976, 11 pages.
Korean Office Action dated Aug. 26, 2021, in Korean Application No. 10-2019-0094323, (6 pgs) and Decision of Rejection of Amendment, with English transiation. (4 pgs).
Korean Office Action dated Oct. 22, 2021 in Korean Application No. 10-2019-0094323 with English Machine translation, 7 pgs.
Office Action dated Oct. 18, 2022 in counterpart Korean Application No. 10-2021 -0154547, along with an English translation.
Korean Office Action dated Feb. 25, 2021 in Korean Application No. 10-2019-0094323, with English translation, 8 pgs.

* cited by examiner

ELECTRON OPTICAL SYSTEM AND MULTI-BEAM IMAGE ACQUIRING APPARATUS

CROSS-REFERENCE TO RELATED APPLICATION

This application is based upon and claims the benefit of priority from prior Provisional Patent Application No. 62/714,245 filed on Aug. 3, 2018 in U.S.A., the entire contents of which are incorporated herein by reference.

BACKGROUND OF THE INVENTION

Field of the Invention

Embodiments of the present invention relate to an electron optical system and a multi-beam image acquiring apparatus. For example, embodiments of the present invention relate to an inspection apparatus for inspecting a pattern by acquiring a secondary electron image of the pattern emitted by irradiation with multiple electron beams.

Description of Related Art

In recent years, with the advance of high integration and large capacity of LSI (Large Scale Integrated circuits), the line width (critical dimension) required for circuits of semiconductor elements is becoming increasingly narrower. Since LSI manufacturing requires a tremendous amount of manufacturing cost, it is crucially essential to improve its yield. However, as typified by a 1-gigabit DRAM (Dynamic Random Access Memory), the scale of patterns which configure the LSI now has become on the order of nanometers from submicrons. Also, in recent years, with miniaturization of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultrafine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image acquired by imaging a pattern formed on a substrate, such as a semiconductor wafer or a lithography mask, with design data or with another measured image acquired by imaging an identical pattern on the substrate. For example, as a pattern inspection method, there are "die-to-die inspection" and "die-to-database inspection". The "die-to-die inspection" method compares data of measured images acquired by imaging identical patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After alignment between images, the comparison circuit compares the measured data with the reference data according to an appropriate algorithm, and determines that there is a pattern defect if the compared data do not match with each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another inspection apparatus that acquires a pattern image by scanning the inspection substrate with electron beams and detecting secondary electrons emitted from the inspection substrate by the irradiation with the electron beams. With the inspection apparatus utilizing an electron beam, an apparatus using multiple beams has also been under development. Then, when using multiple beams, it is necessary to irradiate a target object with multiple primary electron beams while refracting them by an electromagnetic lens, to separate multiple secondary electron beams, which return through the same trajectory, from the multiple primary electron beams, and to guide the multiple secondary electron beams to a detector. For example, the multiple primary electron beams and the multiple secondary electron beams are separated using a Wien filter. Highly precise functional control of the electric field and the magnetic field is important for the electron optical system. When the electric field and the magnetic field are close to each other, since the two fields overlap with each other, thereby decreasing the ability. Thus, a physical protection shield is used. However, since especially a magnetic shield leaks easily, a residual magnetic field is generated, and therefore, optical performance may fall. A passive shield may have undesirable performance because a new fringe field occurs in the magnetic circuit. For example, there is suggested to prevent a magnetic flux from leaking out the Wien filter by using a magnetic material shield (e.g., refer to, U.S. Pat. No. 8,421,029 B2). As for the magnetic field, there is a problem that magnetic field leakage from an electromagnetic lens affects a beam, and thus, it becomes difficult to acquire a highly accurate image. Accordingly, the magnetic field leakage from the electromagnetic lens needs to be inhibited. This problem is not limited to the inspection apparatus, and may similarly occur in the apparatus acquiring an image by using multiple beams.

BRIEF SUMMARY OF THE INVENTION

According to one aspect of the present invention, an electron optical system includes an electromagnetic lens configured to include a yoke, and refract an electron beam passing through the yoke by generating a magnetic field; and a shield coil disposed along an inner wall of the yoke, and configured to reduce a leakage magnetic field generated by the electromagnetic lens.

According to another aspect of the present invention, a multi-electron-beam image acquiring apparatus includes an electromagnetic lens configured to include a yoke, and refract primary multiple electron beams passing through the yoke by generating a magnetic field; a shield coil disposed along an inner wall of the yoke and configured to reduce a leakage magnetic field generated by the electromagnetic lens; a beam separator disposed in the yoke, and configured to separate, in the yoke, the primary multiple electron beams and secondary electron beams generated, including reflected electrons, because a substrate is irradiated with the primary multiple electron beams having passed through the electromagnetic lens, and configured by structural components including magnetic material; and a detector configured to detect the secondary electron beams having been separated.

DETAILED DESCRIPTION OF THE INVENTION

Embodiments below describe a multi-electron-beam inspection apparatus as an example of a multi-electron-beam image acquiring apparatus. The multi-electron-beam image acquiring apparatus is not limited to the inspection apparatus, and may be an apparatus irradiating multiple electron beams so as to acquire an image, for example.

First Embodiment

Figure 1:
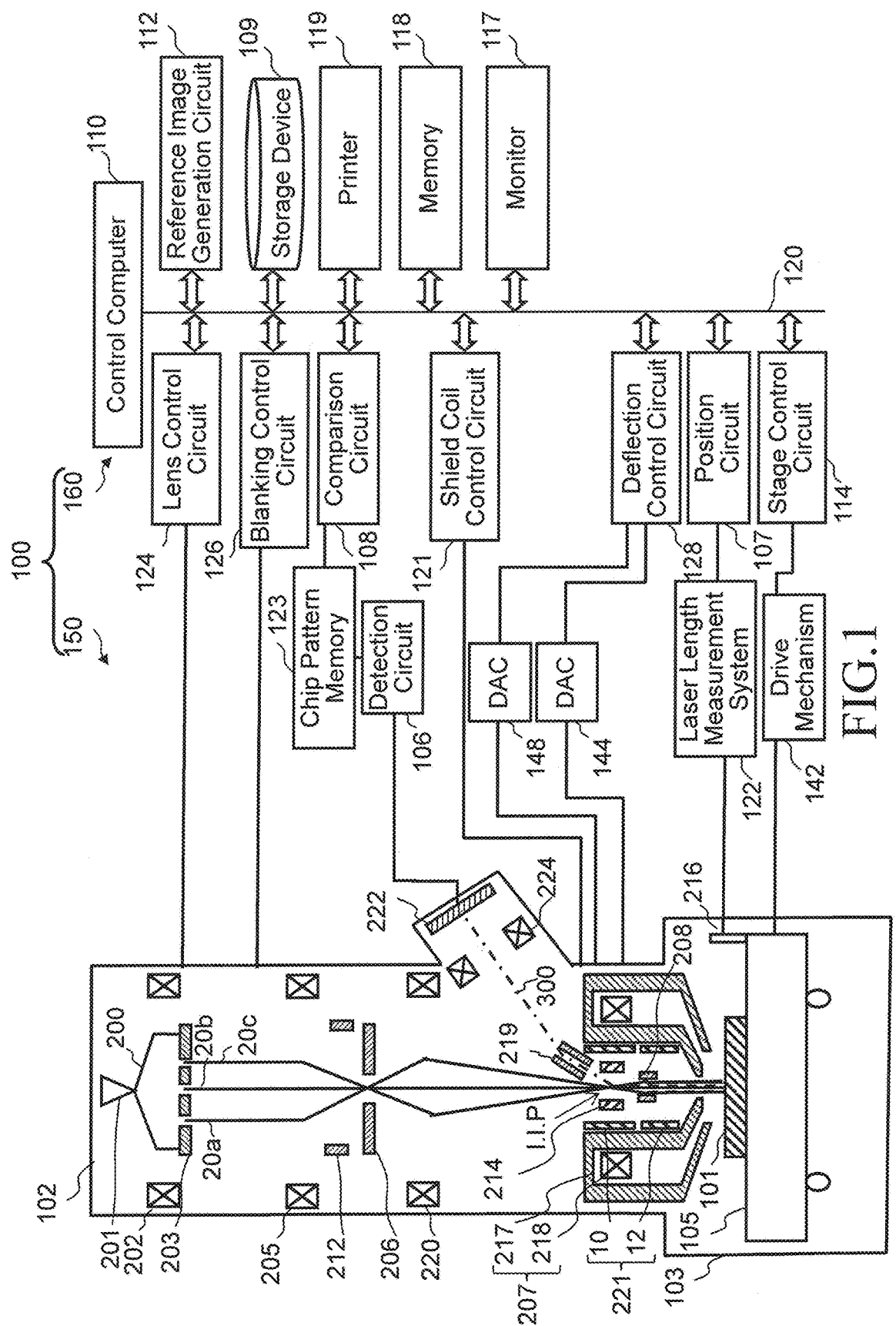
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on a substrate is an example of a multi-electron-beam inspection apparatus. The inspection apparatus 100 includes an image acquisition mechanism 150 and a control system circuit 160. The image acquisition mechanism 150 includes an electron beam column 102 (also called an electron optical column) (an example of a multi-beam column), an inspection chamber 103, a detection circuit 106, a chip pattern memory 123, a stage drive mechanism 142, and a laser length measuring system 122. In the electron beam column 102, there are arranged an electron gun 201, an illumination lens 202, a shaping aperture array substrate 203, an electromagnetic lens 205, a common blanking deflector 212, a limiting aperture substrate 206, an electromagnetic lens 220, a beam separator 214, an objective lens 207, a shield coil 221, a deflector 208, a deflector 219, a projection lens 224, and a multi-detector 222.

An XY stage 105 movable at least in the x-y plane is disposed in the inspection chamber 103. A substrate 101 (target object) to be inspected is mounted on the XY stage 105. The substrate 101 may be an exposure mask substrate, or a semiconductor substrate such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the XY stage 105, for example. Moreover, on the XY stage 105, there is disposed a mirror 216 which reflects a laser beam for measuring a laser length emitted from the laser length measuring system 122 disposed outside the inspection chamber 103. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a shield coil control circuit 121, a lens control circuit 124, a blanking control circuit 126, a deflection control circuit 128, a storage device 109 such as a magnetic disk drive, a monitor 117, a memory 118, and a printer 119. The deflection control circuit 128 is connected to DAC (digital-to-analog conversion) amplifiers 144 and 148. The DAC amplifier 146 is connected to the deflector 208. The DAC amplifier 148 is connected to the deflector 219. Moreover, the shield coil control circuit 121 is connected to the shield coil 221.

The chip pattern memory 123 is connected to the comparison circuit 108. The XY stage 105 is driven by the drive mechanism 142 under the control of the stage control circuit 114. With respect to the drive mechanism 142, for example, the drive system, such as a three (x-, y-, and θ-) axis motor which provides drive in the directions of x, y, and θ in the stage coordinate system, can move the XY stage 105. A step motor, for example, can be used as each of these x, y, and θ motors (not shown). The XY stage 105 is movable in the horizontal direction and the rotation direction by the motors of the x-axis, y-axis, and θ-axis. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216. In the stage coordinate system, the x, y, and θ directions are set with respect to a plane orthogonal to the optical axis of the multiple primary electron beams, for example.

The common blanking deflector 212 is composed of at least two electrodes (or "at least two poles"), and controlled by the blanking control circuit 126. The deflector 208 is composed of at least four electrodes (or "at least four poles"), and controlled by the deflection control circuit 128 through the DAC amplifier 144 disposed for each electrode. Similarly, the deflector 219 is composed of at least four electrodes (or "at least four poles"), and controlled by the deflection control circuit 128 through the DAC amplifier 148 disposed for each electrode. The shield coil 221 is controlled by the shield coil control circuit 121.

FIG. 1 shows configuration elements necessary for describing the first embodiment. It should be understood that other configuration elements generally necessary for the inspection apparatus 100 may also be included therein.

Figure 2:
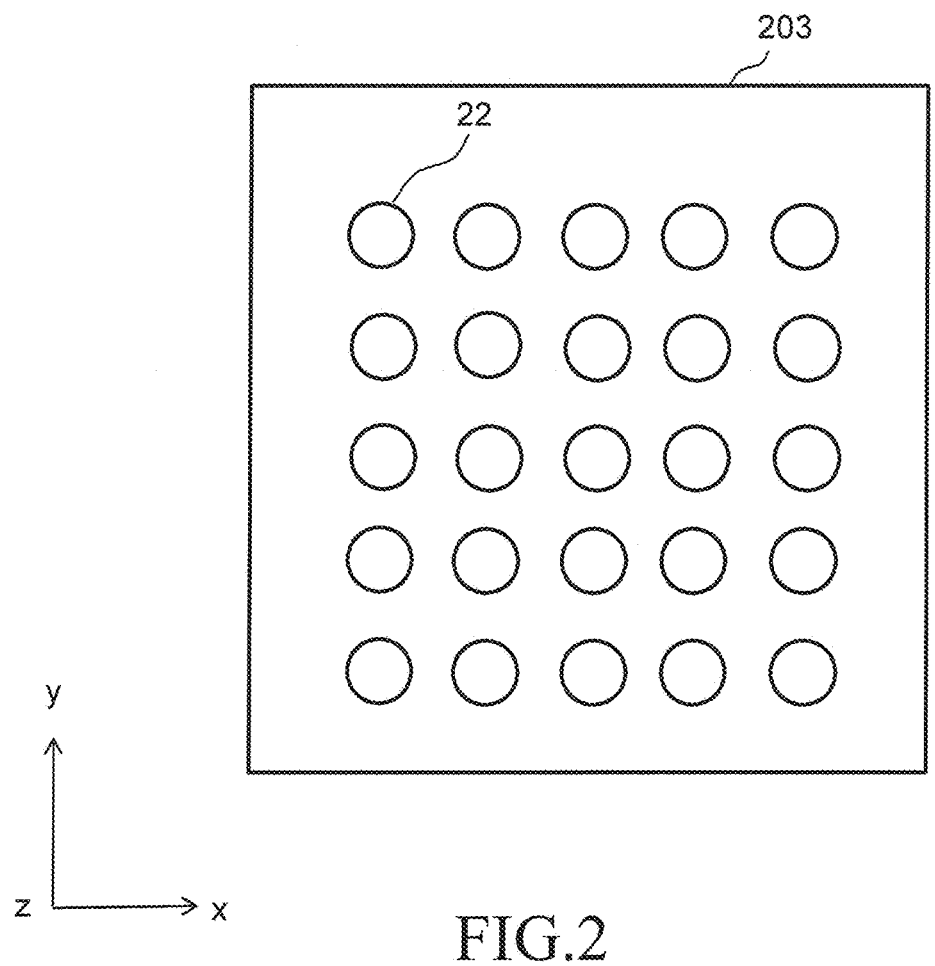
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) and $n_1$ rows long (length in the y direction) are two-dimensionally formed at a predetermined arrangement pitch in the shaping aperture array substrate 203, where $m_1$ and $n_1$ are integers of 2 or more. In the case of FIG. 2, holes (openings) 22 of 5×5, that is 5(columns of holes arrayed in the x direction)×5(rows of holes arrayed in the y direction), are formed. The arrangement number of the holes 22 is not limited thereto. Each of the holes 22 is a circle with the same outer diameter. Alternatively, each of the holes 22 may be a rectangle (including a square) having the same dimension, shape, and size. Multiple beams 20 are formed by letting portions of the electron beam 200 individually pass through a corresponding one of a plurality of holes 22. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in they direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2) th row may be mutually displaced in the width direction (in the x direction) by a dimension "b".

Now, operations of the image acquisition mechanism 150 in the inspection apparatus 100 are described below.

The electron beam 200 emitted from the electron gun 201 (emission source) almost perpendicularly (e.g., vertically) illuminates the whole of the shaping aperture array substrate 203 by the illumination lens 202. As shown in FIG. 2, a plurality of holes 22 (openings) are formed in the shaping aperture array substrate 203. The region including all the plurality of holes 22 is irradiated by the electron beam 200. For example, a plurality of electron beams 20a to 20c (multiple primary electron beams 20) (solid lines in FIG. 1) are formed by letting portions of the electron beam 200, which irradiate the positions of a plurality of holes 22, individually pass through a corresponding one of the plurality of holes 22 in the shaping aperture array substrate 203.

The formed multiple primary electron beams 20 are refracted toward the hole in the center of the limiting aperture substrate 206 by the electromagnetic lens 205. In other words, when receiving the incident multiple primary electron beams 20, the electromagnetic lens 205 refract them. Here, the electromagnetic lens 205 refracts the multiple primary electron beams 20 such that the focus position of each beam is located at the position of the hole in the center of the limiting aperture substrate 206. At this stage, when all of the multiple primary electron beams 20 are collectively deflected by the common blanking deflector 212, they deviate from the hole in the center of the limiting aperture substrate 206 so as to be blocked by the limiting aperture substrate 206. On the other hand, the multiple primary electron beams 20 which were not deflected by the common blanking deflector 212 pass through the hole in the center of the limiting aperture substrate 206 as shown in FIG. 1. Blanking control of all the multiple beams 20 is collectively provided by ON/OFF of the common blanking deflector 212 to collectively control ON/OFF of the multiple primary electron beams. Thus, the limiting aperture substrate 206 blocks the multiple primary electron beams 20 which were deflected to be in the OFF condition by the common blanking deflector 212. Then, the multiple primary electron beams 20 for inspection are formed by the beams having been made during a period from becoming "beam ON" to becoming "beam OFF" and having passed through the limiting aperture substrate 206.

The multiple primary electron beams 20 having passed through the limiting aperture substrate 206 travel toward the electromagnetic lens 220. Receiving the incident multiple primary electron beams 20, the electromagnetic lens 220 refracts them. The multiple primary electron beams 20 form an intermediate image plane (I.I.P) by the electromagnetic lens 220. After passing through the beam separator 214 disposed at the position of the intermediate image plane, the multiple primary electron beams 20 are focused on the substrate 101 (target object) by the objective lens 207 to be a pattern image (beam diameter) of a desired reduction ratio. Then, all the multiple primary electron beams 20 having passed through the limiting aperture substrate 206 are collectively deflected in the same direction by the deflector 208 in order to irradiate respective beam irradiation positions on the substrate 101. According to the first embodiment, scanning is performed while continuously moving the XY stage 105, for example. Therefore, the deflector 208 performs tracking deflection to follow the movement of the XY stage 105. Then, the deflector 208 collectively deflects all of the multiple primary electron beams 20 so that each beam may scan a corresponding region. Ideally, the multiple primary electron beams 20 irradiating at a time are aligned at the pitch obtained by multiplying the arrangement pitch of a plurality of holes 22 in the shaping aperture array substrate 203 by a desired reduction ratio (1/a). Thus, the electron beam column 102 irradiates the substrate 101 with two-dimensional $m_1 \times n_1$ multiple beams 20 at a time.

A flux of secondary electrons (multiple secondary electron beams 300) (dotted lines in FIG. 1) including reflected electrons, each corresponding to each of the multiple primary electron beams 20, is emitted from the substrate 101 because desired positions on the substrate 101 are irradiated with the multiple primary electron beams 20.

The multiple secondary electron beams 300 emitted from the substrate 101 are refracted toward their center by the objective lens 207, and travel toward the beam separator 214 disposed at the intermediate image plane (I.I.P).

The beam separator 214 generates an electric field and a magnetic field to be orthogonal to each other in a plane perpendicular to the traveling direction (optical axis) of the center beam of the multiple beams 20. The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20.

The multiple secondary electron beams 300 bent obliquely upward and separated from the multiple primary electron beams 20 are further bent by the deflector 219 to travel to the projection lens 224. Then, the multiple secondary electron beams 300 deflected by the deflector 219 are projected onto the multi-detector 222 while being refracted by the projection lens 224. The multi-detector 222 detects the projected multiple secondary electron beams 300. The multi-detector 222 includes, for example, a diode type two-dimensional sensor (not shown). Then, at a diode type two-dimensional sensor position corresponding to each beam of the multiple beams 20, each secondary electron of the multiple secondary electron beams 300 collides with a diode type two-dimensional sensor to generate an electron, and produces secondary electron image data for each pixel. Since scanning is performed while continuously moving the XY stage 105, tracking deflection is provided as described above. The deflector 219 cancels out (compensates for) deviation of the light receiving position of the multiple secondary electron beams 300 on the electron receiving surface of the multi-detector 222, which is due to movement of the deflection positions of the multiple primary electron beams 20 along with the tracking deflection and scanning operation, and deflects the multiple secondary electron beams 300 so that they may irradiate respective desired positions on the electron receiving surface of the multi-detector 222. Then, the multi-detector 222 detects the multiple secondary electron beams 300. An image is formed on the substrate 101 by an intensity signal detected by the multi-detector 222.

Figure 3A:
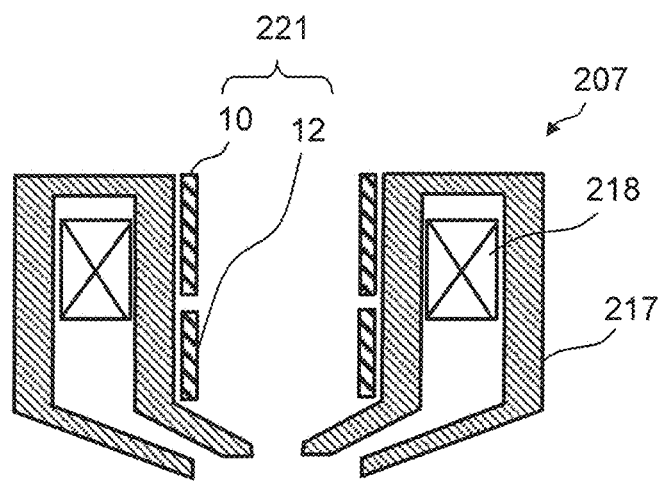
FIG. 3A is a longitudinal-sectional view and FIG. 3B is a top view for illustrating a relation between an electromagnetic lens and a shield coil according to the first embodiment.
Figure 3B:
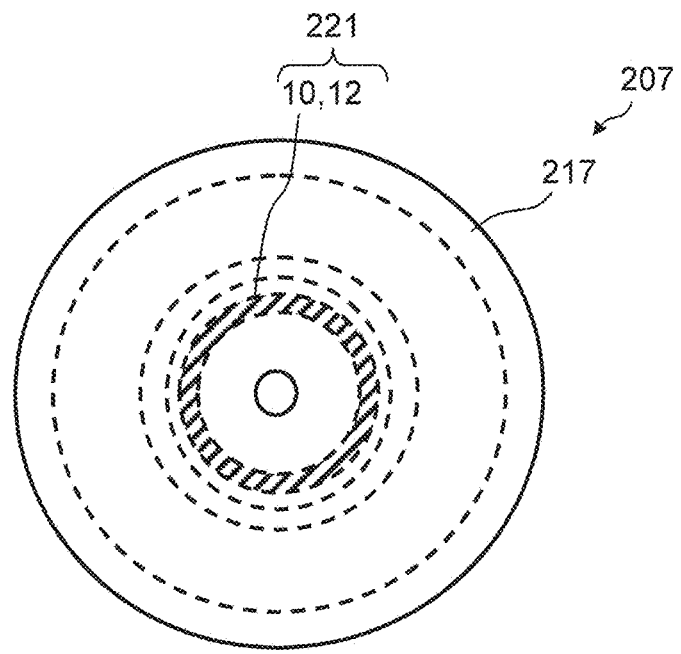

FIG. 3A is a longitudinal-sectional view and FIG. 3B is a top view for illustrating a relation between an electromagnetic lens and a shield coil according to the first embodiment. Each electromagnetic lens, such as the illumination lens 202, electromagnetic lens 205, electromagnetic lens 220, and objective lens 207, for refracting the multiple primary electron beams 20 (or electron beam 200) is composed of a coil disposed surrounding the optical axis of the multiple primary electron beams 20 (or electron beam 200), and a yoke (pole piece) surrounding the coil. An opening (also called a crevice or gap) for leaking high-density magnetic field lines made by the coil toward the optical axis of the multiple primary electron beams 20 (or electron beam 200) is formed in the yoke. In the case of FIGS. 3A and 3B, the objective lens 207 is described as an example. In FIGS. 3A and 3B, the objective lens 207 includes a coil 218 and a yoke 217. The yoke 217 is vertically long along the optical axis, and, for example, a longwise coil 218 is arranged thereinside. The yoke 217 is open at the central portion between the upper and lower sides in order to have a passage region for electron beams. The lower part of the vertically tubular portion of the yoke 217 is tapered diagonally downward toward the center of the trajectory, namely, the optical axis, of all of the multiple primary electron beams 20. In the yoke 217, an opening is formed, near the substrate 101, for making high-density magnetic field lines made by the coil 218 leak toward the optical axis side of the multiple primary electron beams 20 (or electron beam 200). The objective lens 207 generates a high-density magnetic field in the passage region of the multiple primary electron beams 20 close to the opening. The coil 218 is disposed, for example, at the upper side in the space whose inner, outer, and up-and-down surfaces are surrounded by the yoke 217. In such a state, by making the current flow through the coil 218, the coil 218 generates magnetic field lines in the travelling direction (downward in FIG. 3A) of the multiple primary electron beams 20, in the space located optical axis side of the coil 218. By this, a magnetic field is generated, so that the multiple primary electron beams 20 passing through the yoke 217 are refracted. At the same time, the multiple secondary electron beams 300 emitted from the substrate 101 are refracted.

The shield coil 221 is disposed along the inner wall of the yoke 217. Preferably, the shield coil 221 is formed by a coil coaxial to the objective lens 207. The shield coil 221 is disposed, along the inner wall of the yoke 217, such that it surrounds the optical axis of the multiple primary electron beams 20 (or electron beam 200). The shield coil 221 cancels the leakage magnetic field generated by the objective lens 207 (electromagnetic lens). According to the first embodiment, the shield coil 221 is disposed in multiple stages along the inner wall of the yoke 217. In the example of FIGS. 3A and 3B, a shield coil 10 of the first stage and a shield coil 12 of the second stage are disposed along and parallel to the vertical surface of the inner wall of the yoke 217. Although the two-stage shield coils are shown in the example of FIGS. 3A and 3B, it is not limited thereto. It is also preferable to dispose shield coils of three or more stages. The degree of freedom of control can be increased by increasing the number of stages. Of course, the shield coil 10 of only one stage is not excluded. Even if the shield coil 10 of only one stage is disposed, the leakage magnetic field in the vicinity of the disposing position can be reduced.

Since the shield coil 221 (shield coil 10 and shield coil 12) is needed just to generate a magnetic field for cancelling the leakage magnetic field, it can be formed thinner than the coil 218 and the yoke 217. The total length of the shield coils 10 and 12 in the direction of travelling of the multiple primary electron beams 20 is preferably set to be the same as that of the vertical surface of the inner wall of the yoke 217. By this setting, shielding can be achieved in the wide range. However, it is not limited thereto. It may be shorter than the vertical surface of the wall. Alternatively, although not shown, it is also preferable to vertically dispose the shield coil 12 to be close to the tapered wall surface of the inner wall of the yoke 217 as close to as not touching it. In that case, preferably, the length of the shield coil 12 is set in the range such that the multiple beams or other optical apparatus do not interfere with the shield coil 12. By making it as long as possible, shielding can be performed in the wide range by the length amount. However, it is not limited thereto. It may be short.

At the inner side of the inner wall of the yoke 217, there is disposed electro-optical equipment configured by structural components including magnetic material. In the example shown in FIG. 1, the beam separator 214 is disposed inside the yoke 217, as an example of the electro-optical equipment. The beam separator 214 is surrounded by the magnetic material, like a Wien filter, for example. Moreover, in the example shown in FIG. 1, as another example of the electro-optical equipment, at least one portion of the deflector 219 for deflecting the multiple secondary electron beams is arranged in the yoke 217. The housing of the deflector 219 is formed by magnetic material, for example. This magnetic material portion is affected by leakage magnetic field from the electromagnetic lens.

Figure 4:
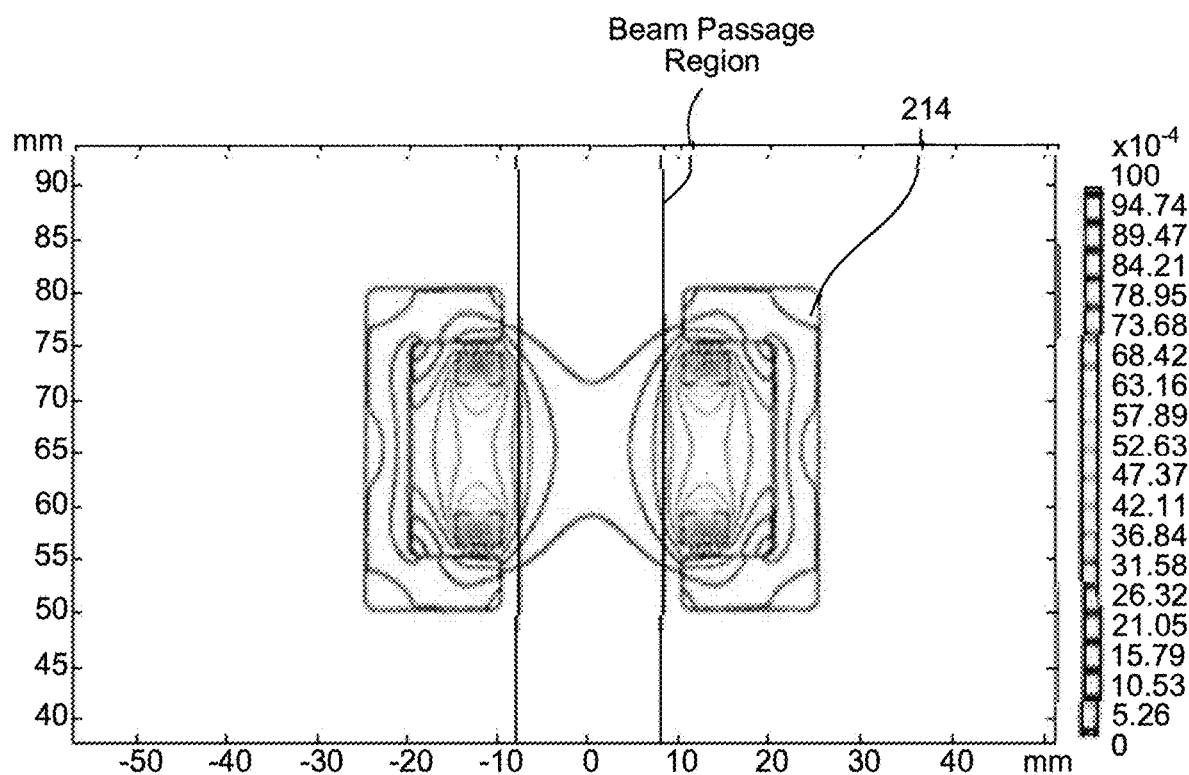
FIG. 4 shows an example of a magnetic field generated by abeam separator according to the first embodiment.

FIG. 4 shows an example of a magnetic field generated by a beam separator according to the first embodiment. FIG. 4 shows the case where a magnetic field is generated by the beam separator 214. As shown in FIG. 4, it turns out that the magnetic field generated by the beam separator 214 produces no leakage magnetic field in the spaces, outside the beam separator 214, for example, at the upstream side and downstream side of the beam separator 214, with respect to the travelling direction of the multiple primary electron beams 20.

Figure 5:
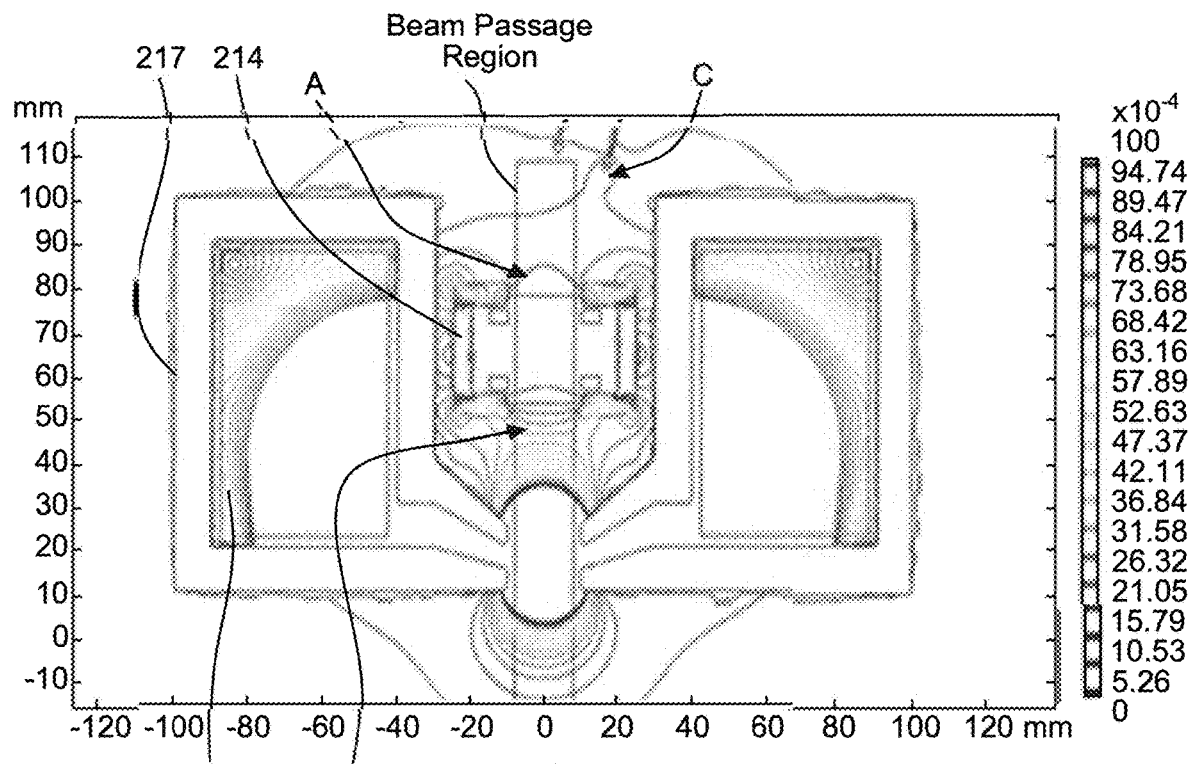
FIG. 5 shows an example of influence of a magnetic field, generated by the objective lens, on a beam separator according to the first embodiment.

FIG. 5 shows an example of influence of a magnetic field, generated by the objective lens, on a beam separator according to the first embodiment. FIG. 5 shows the case where a magnetic field is generated by the objective lens 207 in the state where no magnetic field is generated by the beam separator 214. As shown in FIG. 5, it turns out that magnetic fields have been generated near the entrance (A) and exit (B) of the beam separator 214 located at the upstream side with respect to the region (yoke opening portion) of a high-density magnetic field generated by the objective lens 207. These magnetic fields are concentrated magnetic fields each generated because the magnetic material is affected by the leakage magnetic field produced by the objective lens 207. Moreover, it turns out that a magnetic field has also been generated near the entrance (C) of the deflector 219 at the upstream side of the beam separator 214. This magnetic field is also a concentrated magnetic field generated because the magnetic material is affected by the leakage magnetic field produced by the objective lens 207.

Figure 6:
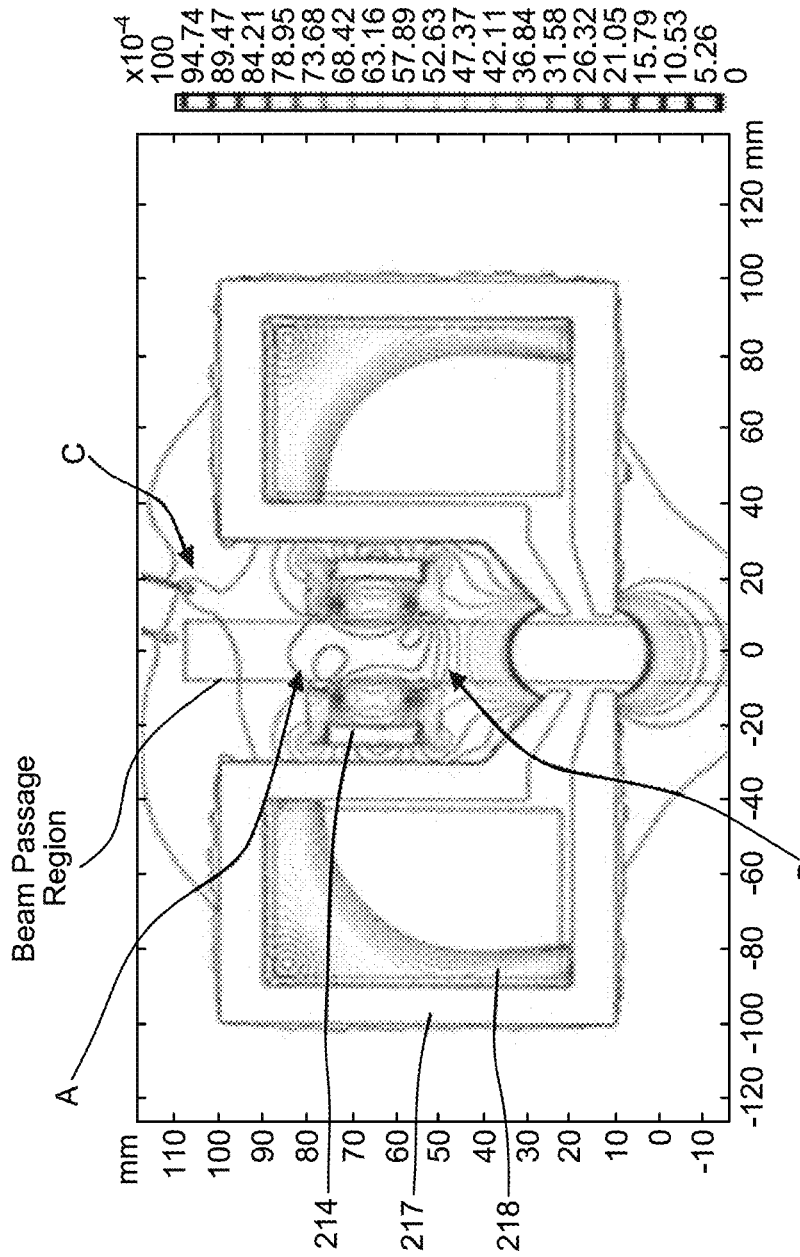
FIG. 6 shows an example of a magnetic field in the case of driving a beam separator in the state where a magnetic field generated by an objective lens has affected the beam separator, according to the first embodiment.

FIG. 6 shows an example of a magnetic field in the case of driving a beam separator in the state where a magnetic field generated by an objective lens has affected the beam separator, according to the first embodiment. FIG. 6 shows the case in which a magnetic field is further generated by the beam separator 214 in the state where a magnetic field has been generated by the objective lens 207. As shown in FIG. 6, the magnetic fields near the entrance (A) and exit (B) of the beam separator 214 form irregular magnetic fields because further changed by an interaction between the leakage magnetic field generated by the objective lens 207 and the magnetic field of the beam separator 214 itself.

Figure 7:
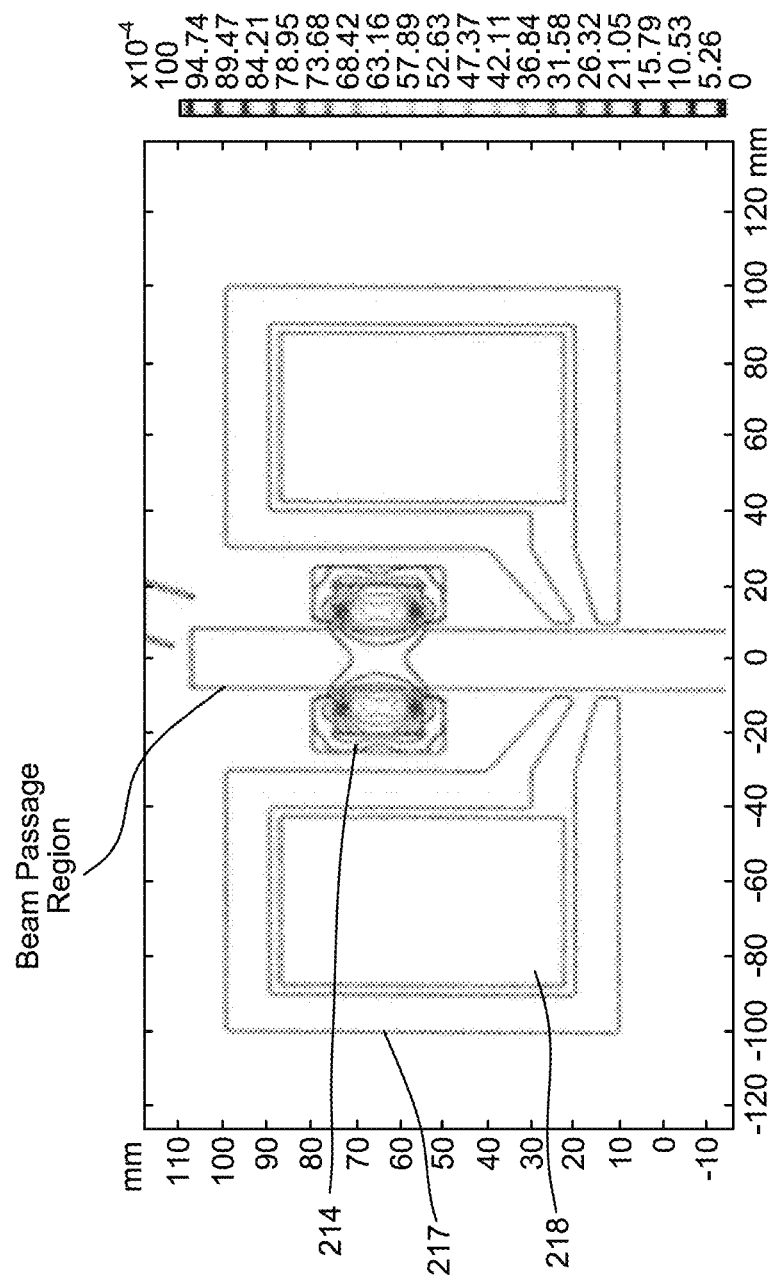
FIG. 7 shows an example of a magnetic field in the case of driving a beam separator in the state where no magnetic field has been generated by an objective lens, according to the first embodiment.

FIG. 7 shows an example of a magnetic field in the case of driving a beam separator in the state where no magnetic field has been generated by an objective lens, according to the first embodiment. As described with reference to FIG. 4, the magnetic field generated by the beam separator 214 produces no leakage magnetic field in the spaces, outside the beam separator 214, at the upstream side and downstream side of the beam separator 214, with respect to the travelling direction of the multiple primary electron beams 20. Therefore, even when the beam separator 214 is arranged in the yoke 217 of the objective lens 207, similarly, the magnetic field generated by the beam separator 214 produces no leakage magnetic field in the spaces, outside the beam separator 214, at the upstream side and downstream side of the beam separator 214, with respect to the travelling direction of the multiple primary electron beams 20. Furthermore, no leakage magnetic field is generated near the entrance (C) of the deflector 219 at the upstream side.

Thus, it was found that the cause of the leakage magnetic field results from the objective lens 207 not from the beam separator 214. Then, under the influence of the leakage magnetic field, it is difficult to acquire a highly accurate image since the beam trajectory is deviated. According to the first embodiment, the leakage magnetic field is efficiently reduced in the narrow arrangement space by using the shield coil 221. Specifically, the shield coil control circuit 121 supplies an excitation current to the shield coils 10 and 12 in the direction to reduce the leakage magnetic field generated by the objective lens 207. The excitation current supplied to the shield coils 10 and 12 may be in the same direction. According to the first embodiment, by independently controlling the two-stage shield coils 10 and 12, correction can be performed in accordance with the state of the leakage magnetic field.

Figure 8:
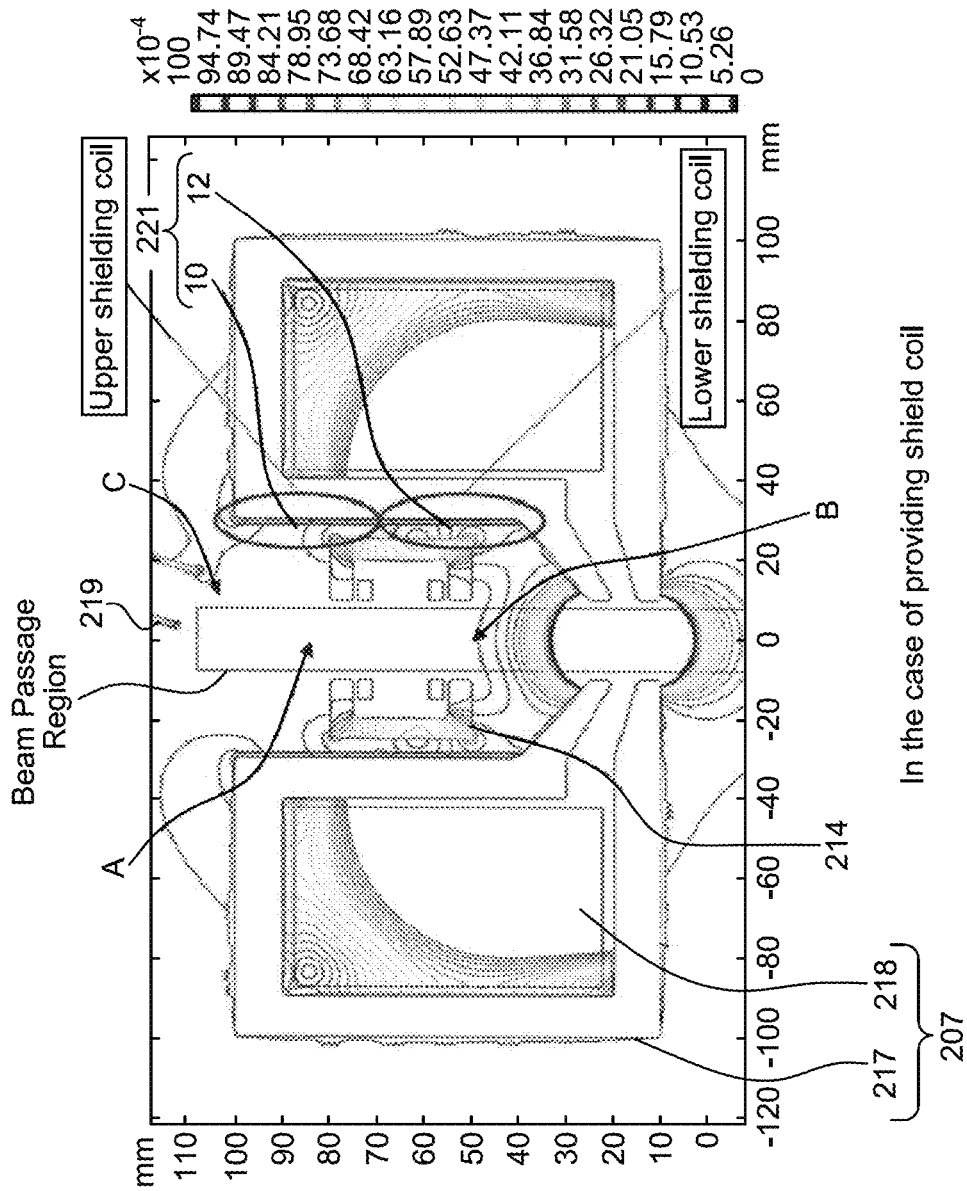
FIG. 8 shows an example of a magnetic field in the vicinity of a beam separator after correction according to the first embodiment.

FIG. 8 shows an example of a magnetic field in the vicinity of a beam separator after correction according to the first embodiment. In the state before the correction shown in FIG. 6, concentration of the magnetic field occurs near the entrance (A) and exit (B) of the beam separator 214 because the magnetic material is affected by the leakage magnetic field generated by the objective lens 207. On the other hand, it is found that the magnetic fields generated near the entrance (A) and exit (B) of the beam separator 214 have been substantially canceled by correcting with the shield coil 221 as shown in FIG. 8. Moreover, it is found that the concentration of the magnetic field near the entrance (C) of the deflector 219 at the upstream side has also been reduced greatly. As described above, according to the first embodiment, the leakage magnetic field which cannot be completely prevented by the beam separator 214 itself can be canceled or reduced by correcting with the shield coil 221 arranged along the inner wall of the yoke 217.

Figure 9:
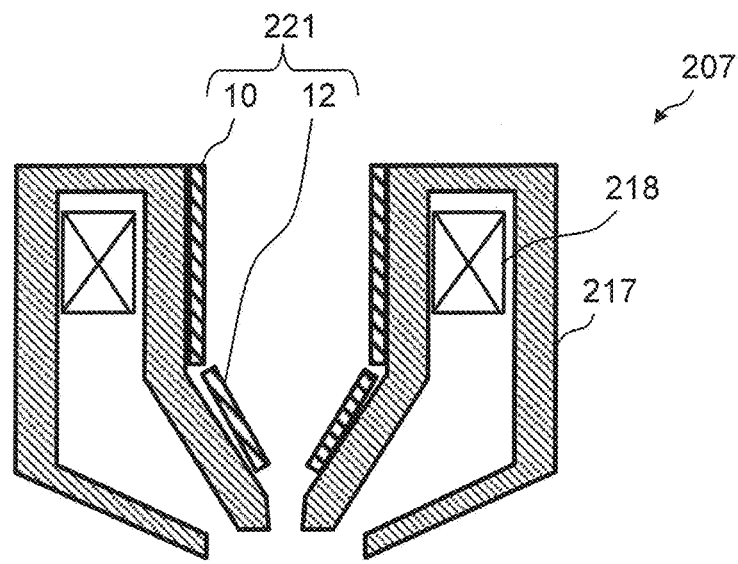
FIG. 9 is a sectional view showing a modified example of arrangement of a shield coil according to the first embodiment.

FIG. 9 is a sectional view showing a modified example of arrangement of a shield coil according to the first embodiment. In FIG. 9, the structure of the objective lens 207 is the same as that in FIG. 3. However, in FIG. 9, the tapered portion of the yoke 217 is highlighted. FIG. 9 shows the case where the shield coil 12 of the second stage is arranged in parallel with the inner wall surface of the tapered yoke 217. Other structure is the same as that of FIG. 3. The leakage magnetic field can be canceled or reduced even in this structure.

Figure 10:
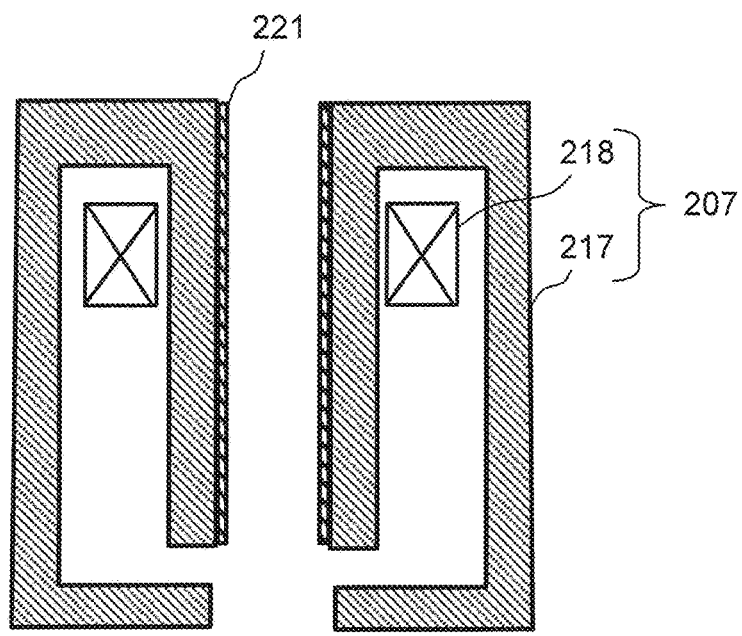
FIG. 10 is a sectional view showing another modified example of arrangement of a shield coil according to the first embodiment.

FIG. 10 is a sectional view showing another modified example of arrangement of a shield coil according to the first embodiment. In FIG. 10, the yoke 217 of the objective lens 207 does not taper at the downstream side in the travelling direction of the multiple primary electron beams 20. In that case, since the direction of the inner wall of the yoke 217 does not change, it is also preferable to arrange the shield coil 221 of the first stage to be along and parallel to the vertical inner wall surface of the yoke 217, and to have a length equivalent to that of the inner wall surface. Needless to say, it is also preferable to arrange shield coils in multiple stages.

Figure 11:
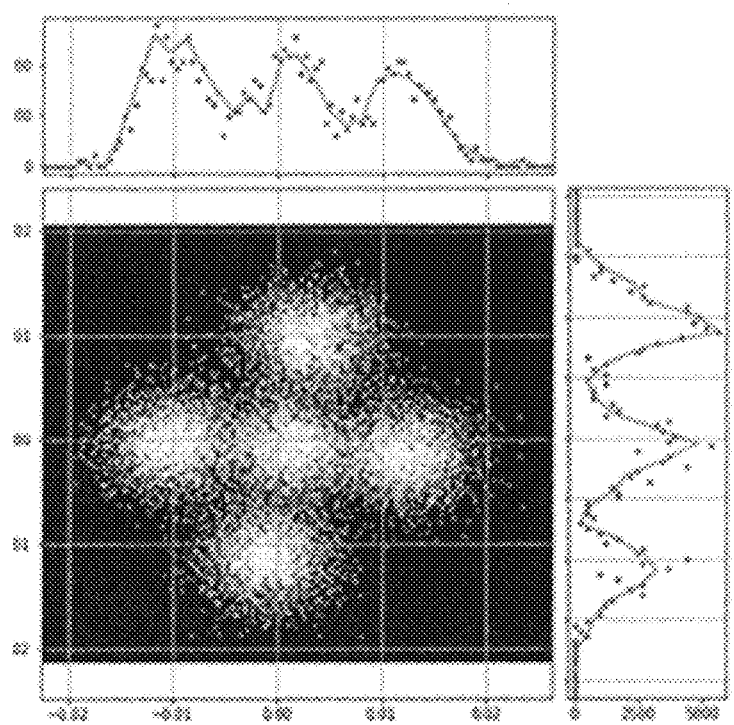
FIG. 11 shows an example of an image captured in the state where a leakage magnetic field has not been corrected by a shield coil, according to the first embodiment.

FIG. 11 shows an example of an image captured in the state where a shield coil is not provided and a leakage magnetic field has not been corrected according to the first embodiment.

Figure 12:
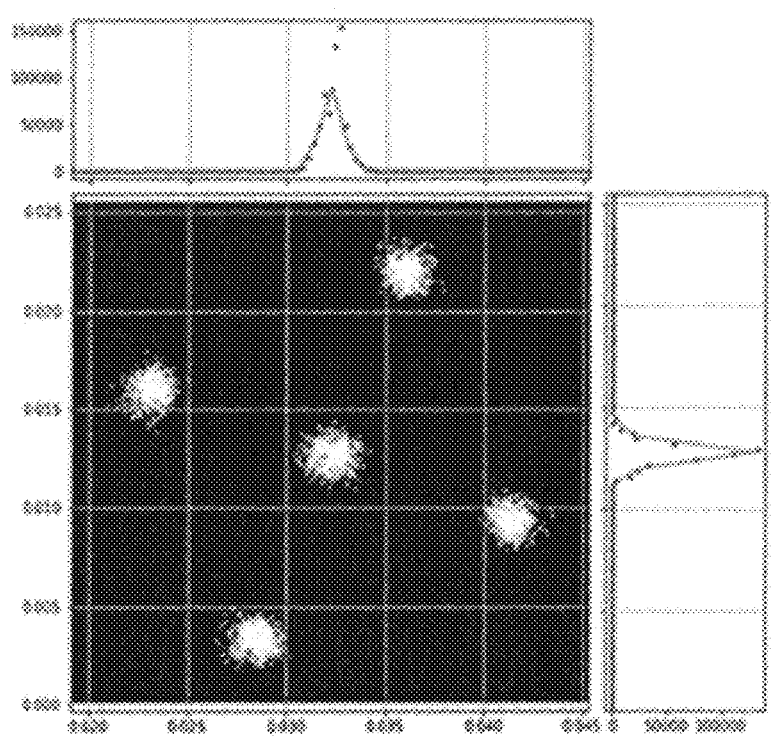
FIG. 12 shows an example of an image captured in the state where a leakage magnetic field has been corrected by a shield coil, according to the first embodiment.

FIG. 12 shows an example of an image captured in the state where a shield coil is provided and a leakage magnetic field has been corrected according to the first embodiment. As shown in FIG. 11, since the beam trajectory deviates due to magnetic field concentration by the leakage magnetic field which is generated in the magnetic material part (beam separator 214) in the yoke 217 of the objective lens 207, the focus position deviates, and therefore, an acquired image becomes blurred. On the other hand, it is possible to suppress the magnetic field concentration in the magnetic material part (beam separator 214) in the yoke 217 by using the shield coil 221, cancelling or reducing the leakage magnetic field generated by the objective lens 207, near the inner wall of the yoke 217. Therefore, the deviation of the focus position is suppressed since the deviation of the beam trajectory resulting from the leakage magnetic field does not occur, thereby an image clearer than that before the correction can be acquired as shown in FIG. 12.

Thus, with the structure described above, pattern inspection of the inspection substrate is performed using the multiple secondary electron beams 300 with respect to which the leakage magnetic field generated by the electromagnetic lens has been canceled or reduced.

Figure 13:
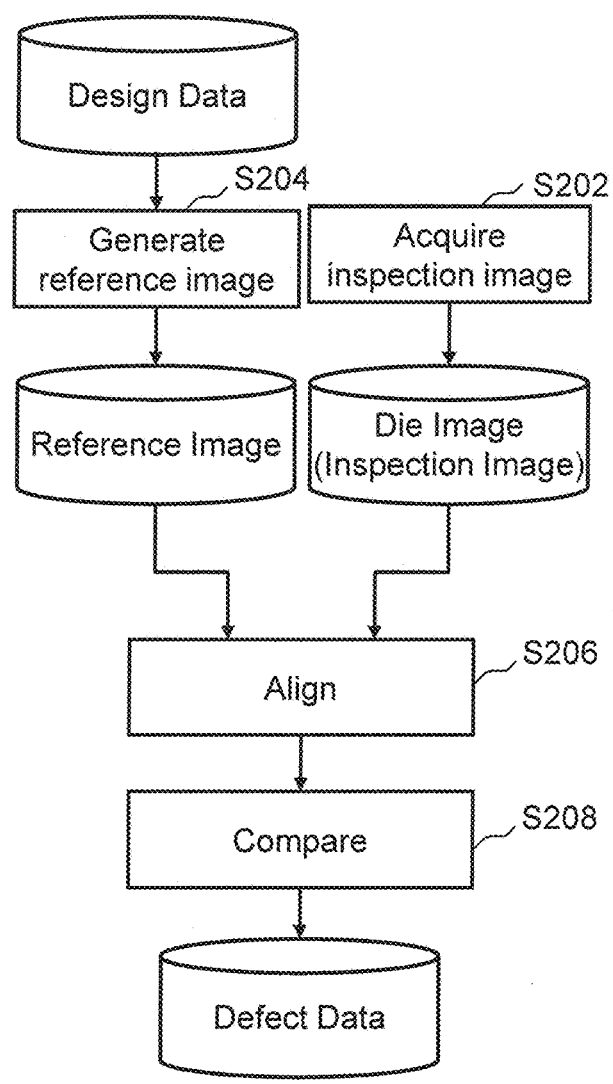
FIG. 13 is a flowchart showing main steps of an inspection method according to the first embodiment.

FIG. 13 is a flowchart showing main steps of an inspection method according to the first embodiment. In FIG. 13, the inspection method of the first embodiment executes a series of steps: an inspection image acquisition step (S202), a reference image generating step (S204), an alignment step (S206), and a comparison step (S208).

In the inspection image acquisition step (S202), the image acquisition mechanism 150 acquires a secondary electron image of a pattern formed on the substrate 101, by using the multiple primary electron beams 20. Specifically, it operates as follows:

As described above, the multiple primary electron beams 20 having passed through the limiting aperture substrate 206 pass through the beam separator 214, and are focused on the substrate 101 (target object) by the objective lens 207 in order to irradiate respective beam irradiation positions on the substrate 101 by the main deflector 208 and the sub deflector 209.

The multiple secondary electron beams 300 including reflected electrons, each corresponding to each of the multiple primary electron beams 20, are emitted from the substrate 101 because desired positions on the substrate 101 are irradiated with the multiple primary electron beams 20. The multiple secondary electron beams 300 emitted from the substrate 101 pass through the objective lens 207, travel to the beam separator 214, and are bent obliquely upward. Then, the multiple secondary electron beams 300 having been bent obliquely upward are projected on the multi-detector 222, while being refracted, by the projection lens 224. Thus, the multi-detector 222 detects the multiple secondary electron beams 300, including reflected electrons, emitted because the substrate 101 surface is irradiated with the primary electron multiple beams 20.

Figure 14:
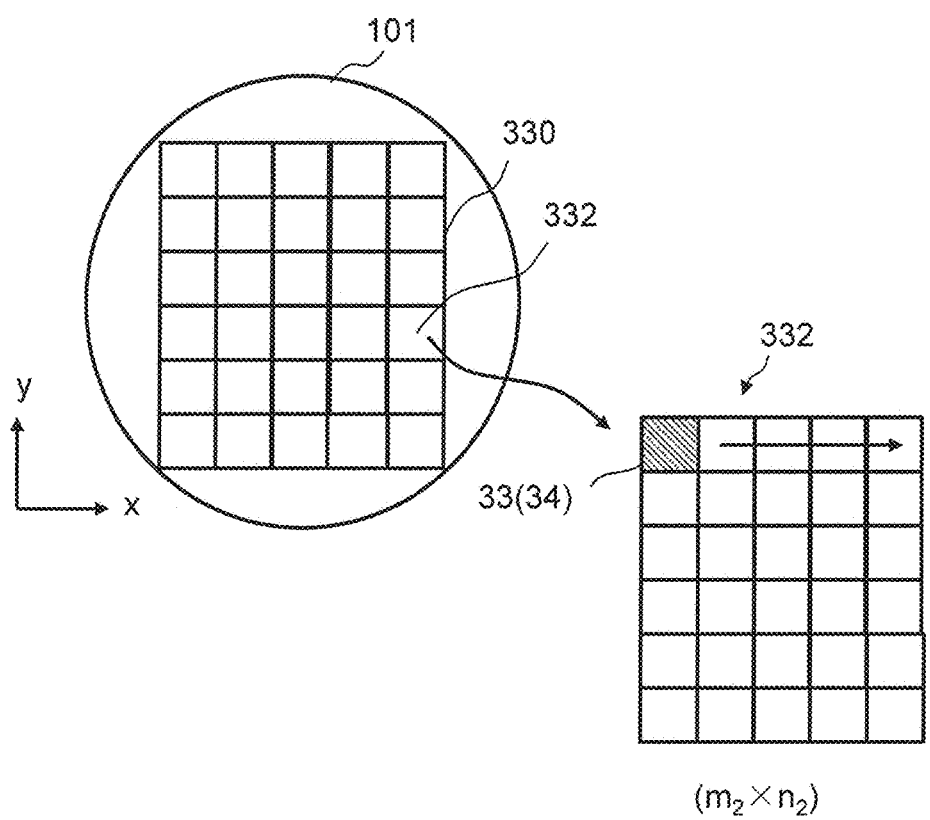
FIG. 14 shows an example of a plurality of chip regions formed on a semiconductor substrate, according to the first embodiment.

FIG. 14 shows an example of a plurality of chip regions formed on a semiconductor substrate, according to the first embodiment. In FIG. 14, in the case of the substrate 101 being a semiconductor substrate (wafer), a plurality of chips (wafer dies) 332 in a two-dimensional array are formed in an inspection region 330 of the semiconductor substrate (wafer die). A mask pattern for one chip formed on an exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or more), for example. In the first embodiment, a mask die 33 serves as a unit inspection region.

Figure 15:
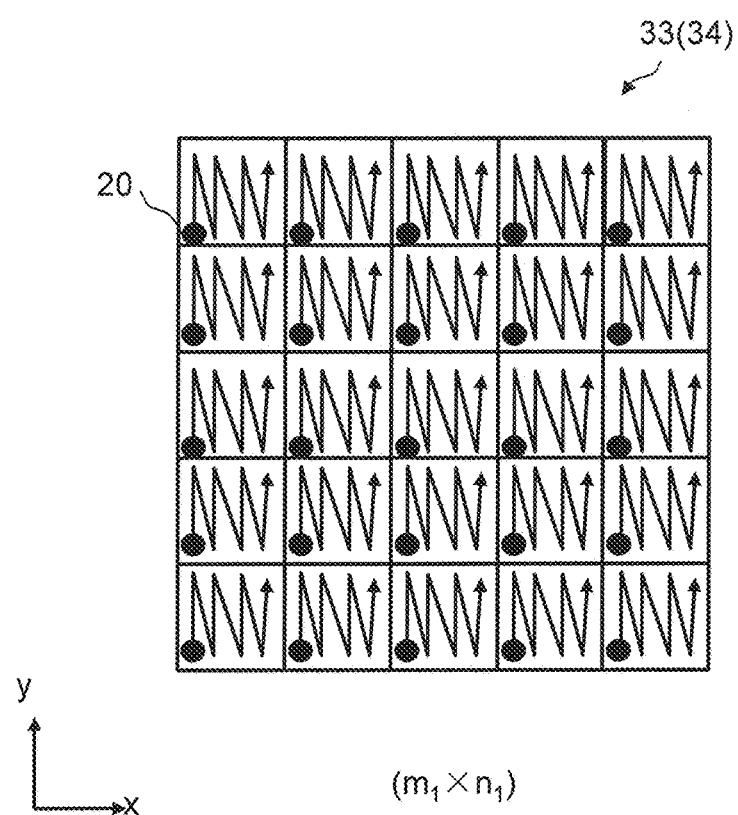
FIG. 15 illustrates a scanning operation using multiple beams according to the first embodiment.

FIG. 15 illustrates a scanning operation with multiple beams according to the first embodiment. FIG. 15 shows the case of multiple primary electron beams 20 of 5×5 (rows by columns). The size of an irradiation region 34 that can be irradiated by one irradiation with the multiple primary electron beams 20 is defined by (x direction size obtained by multiplying pitch between beams in the x direction of the multiple primary electron beams 20 on the substrate 101 by the number of beams in the x direction)×(y direction size obtained by multiplying pitch between beams in the y direction of the multiple primary electron beams 20 on the substrate 101 by the number of beams in the y direction). In the case of FIG. 15, the irradiation region 34 and the mask die 33 are of the same size. However, it is not limited thereto. The irradiation region 34 may be smaller than the mask die 33, or larger than it. Each beam of the multiple primary electron beams 20 scans the inside of a sub-irradiation region 29 surrounded by the pitch between beams in the x direction and the pitch between beams in the y direction, where the beam concerned itself is located. Each beam of the multiple primary electron beams 20 is associated with any one of the sub-irradiation regions 29 which are different from each other. At the time of each shot, each beam irradiates the same position in the associated sub-irradiation region 29. Movement of the beam in the sub-irradiation region 29 is executed by collective deflection of the whole multiple primary electron beams 20 by the sub deflector 209. By repeating this operation, one beam irradiates all the pixels in order in one sub-irradiation region 29.

As described above, the whole multiple primary electron beams 20 scan the mask die 33 as the irradiation region 34, and that is, each beam individually scans one corresponding sub-irradiation region 29. After scanning one mask die 33, the irradiation region 34 is moved to a next adjacent mask die 33 so as to be scanned. This operation is repeated to proceed scanning of each chip 332. Due to shots of the multiple primary electron beams 20, secondary electrons are emitted from the irradiated positions at each shot time, and detected by the multi-detector 222.

By performing scanning with the multiple primary electron beams 20 as described above, the scanning operation (measurement) can be performed at a higher speed than scanning with a single beam. The scanning of each mask die 33 may be performed by the "step and repeat" operation, alternatively it may be performed by continuously moving the XY stage 105. When the irradiation region 34 is smaller than the mask die 33, the scanning operation can be performed while moving the irradiation region 34 in the mask die 33 concerned.

In the case of the substrate 101 being an exposure mask substrate, the chip region for one chip formed on the exposure mask substrate is divided into a plurality of stripe regions in a strip form by the size of the mask die 33 described above, for example. Then, each mask die 33 is scanned through the same scanning operation described above for each stripe region. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the operation for scanning one chip increases (e.g., four times). However, since a pattern for one chip is formed on the exposure mask substrate, the number of times of scanning can be less compared to the case of the semiconductor substrate on which more than four chips are formed.

As described above, using the multiple primary electron beams 20, the image acquisition mechanism 150 scans the substrate 101 to be inspected on which a figure pattern is formed, and detects the multiple secondary electron beams 300 emitted from the inspection substrate 101 by irradiation with the multiple primary electron beams 20 onto the inspection substrate 101. Detected data (measured image: secondary electron image: image to be inspected) on a secondary electron from each position detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, together with information data on each position from the position circuit 107.

In the reference image generating step (S204), a reference image generation circuit 112 (reference image generation unit) generates a reference image corresponding to an inspection image to be inspected. The reference image generation circuit 112 generates the reference image for each frame region, based on design data serving as a basis for forming a pattern on the substrate 101, or design pattern data defined in exposure image data of a pattern formed on the substrate 101. Preferably, for example, the mask die 33 is used as the frame region. Specifically, it operates as follows: First, design pattern data is read from the storage device 109 through the control computer 110, and each figure pattern defined in the read design pattern data is converted into image data of binary or multiple values.

Here, basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as rectangles, triangles and the like.

When design pattern data used as the figure data is input to the reference image generation circuit 112, the data is developed into data of each figure. Then, the figure code indicating the figure shape, the figure dimensions, and the like of each figure data are interpreted. Then, the reference image generation circuit 112 develops each figure data to design pattern image data of binary or multiple values as a pattern to be arranged in squares in units of grids of predetermined quantization dimensions, and outputs the developed data. In other words, the reference image generation circuit 112 reads design data, calculates an occupancy rate occupied by a figure in the design pattern, for each square region obtained by virtually dividing the inspection region into squares in units of predetermined dimensions, and outputs n-bit occupancy rate data. For example, it is preferable to set one square as one pixel. Assuming that one pixel has a resolution of $1/2^8 (=1/256)$, the occupancy rate in each pixel is calculated by allocating small regions which correspond to the region of figures arranged in the pixel concerned and each of which corresponds to $1/256$ resolution. Then, 8-bit occupancy rate data is output to the reference image generation circuit 112. The square region (inspection pixel) should be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in an analog state continuously changing, it is possible to match/fit the design image data with the measured data by also applying a filtering process to the design image data being image data on the design side whose image intensity (gray scale level) is represented by digital values. The generated image data of a reference image is output to the comparison circuit 108.

Figure 16:
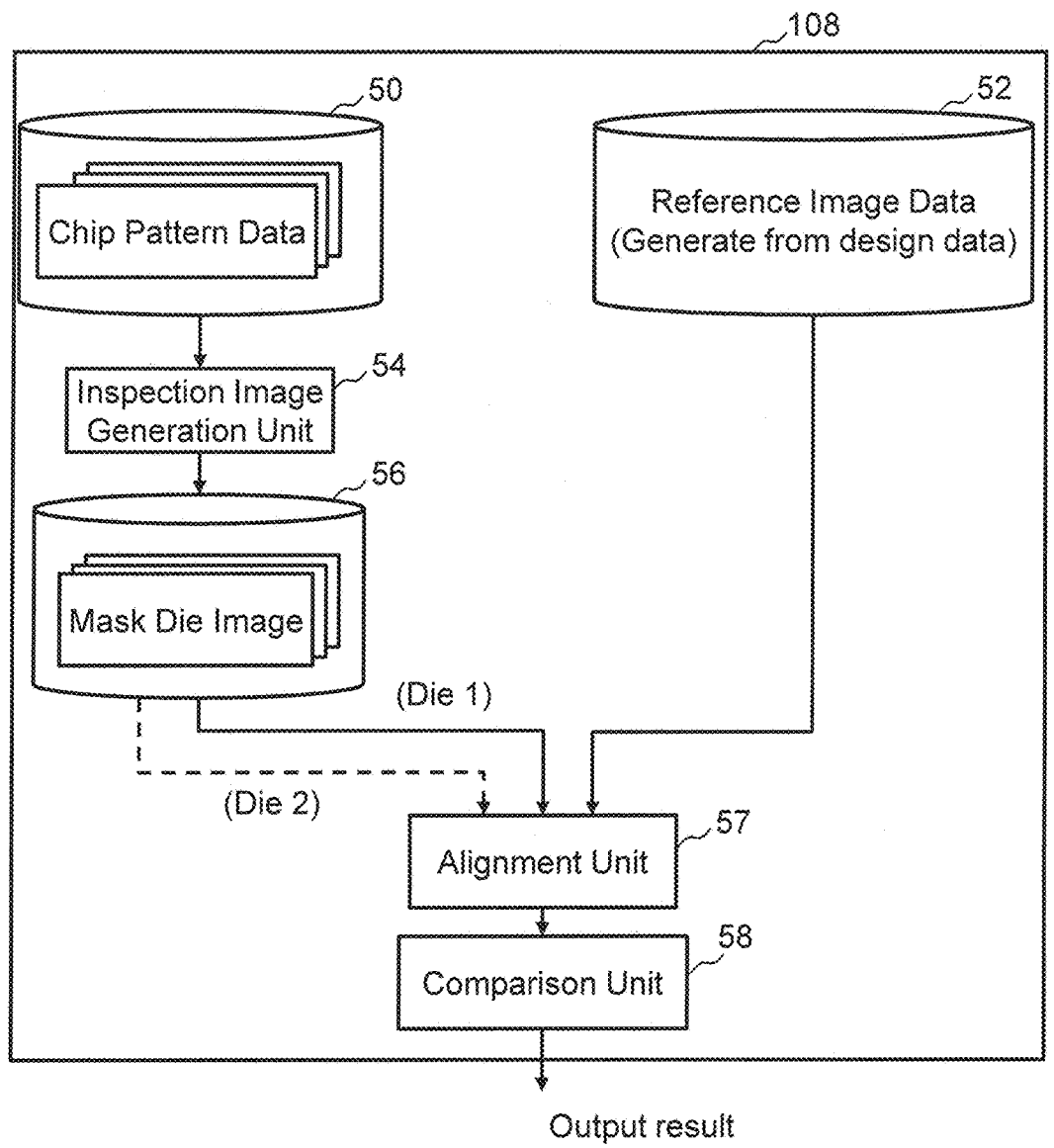
FIG. 16 shows an internal configuration of a comparison circuit according to the first embodiment.

FIG. 16 shows an example of an internal configuration of a comparison circuit according to the first embodiment. In FIG. 16, storage devices 50, 52 and 56, such as magnetic disk drives, an inspection image generation unit 54, an alignment unit 57, and a comparison unit 58 are arranged in the comparison circuit 108. Each of the "units" such as the inspection image generation unit 54, the alignment unit 57, and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the inspection image generation unit 54, the alignment unit 57, and the comparison unit 58, and calculated results are stored in a memory (not shown) or in the memory 118 each time.

In the comparison circuit 108, transmitted stripe pattern data (or chip pattern data) is temporarily stored in the storage device 50, together with information indicating each position from the position circuit 107. Moreover, transmitted reference image data is temporarily stored in the storage device 52.

Next, the inspection image generation unit 54 generates a frame image (inspection image, that is, image to be inspected) by using stripe pattern data (or chip pattern data), for each frame region (unit inspection region) of a predetermined size. As the frame image, here, an image of the mask die 33 is generated, for example. However, the size of the frame region is not limited thereto. The generated frame image (e.g., mask die image) is stored in the storage device 56.

In the alignment step (S206), the alignment unit 57 reads a mask die image serving as an inspection image, and a reference image corresponding to the mask die image, and provides alignment/positioning between the images based on a sub-pixel unit smaller than the pixel 36. For example, the alignment can be performed by a least-square method.

In the comparison step (S208), the comparison unit 58 compares the mask die image (inspection image) and the reference image concerned. The comparison unit 58 compares them, for each pixel 36, based on predetermined determination conditions in order to determine whether there is a defect such as a shape defect. For example, if a gray scale level difference of each pixel 36 is larger than a determination threshold Th, it is determined that there is a defect. Then, the comparison result is output, and specifically, output to the storage device 109, the monitor 117, or the memory 118, or alternatively, output from the printer 119.

Although the die-to-database inspection is described above, the die-to-die inspection may also be performed. In the case of conducting the die-to-die inspection, images of the mask dies 33, where identical patterns are formed, are compared.

Accordingly, a mask die image of a partial region of the wafer die (chip) 332 serving as a die (1), and a mask die image of a corresponding region of another wafer die 332 serving as a die (2) are used. Alternatively, a mask die image of a partial region of the wafer die 332 serving as a die (1), and a mask die image of another partial region other than the above-mentioned partial region of the same wafer die 332 serving as a die (2), where identical patterns are formed, may be compared. In such a case, if one of the images of the mask dies 33 on which identical patterns are formed is used as a reference image, inspection can be performed by the same method as that of the die-to-database inspection described above.

That is, in the alignment step (S206), the alignment unit 57 reads the mask die image of the die (1) and the mask die image of the die (2), and provides alignment between the images based on a sub-pixel unit smaller than the pixel 36. For example, the alignment can be performed by a least-square method.

Then, in the comparison step (S208), the comparison unit 58 compares the mask die image of the die (1) and the mask die image of the die (2). The comparison unit 58 compares them, for each pixel 36, based on predetermined determination conditions in order to determine whether there is a defect such as a shape defect. For example, if a gray scale level difference of each pixel 36 is larger than a determination threshold Th, it is determined that there is a defect. Then, the comparison result is output, and specifically, output to the storage device 109, monitor 117, or memory 118, or alternatively, output from the printer 119.

As described above, according to the first embodiment, magnetic field generation in the optical equipment disposed in an electromagnetic lens, which is generated due to a leakage magnetic field from the electromagnetic lens, can be suppressed, and therefore, images of high accuracy can be acquired.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program to be executed by a processor or the like may be stored in a recording medium, such as a magnetic disk drive, magnetic tape drive, FD, ROM (Read Only Memory), etc. For example, the position circuit 107, the comparison circuit 108, the reference image generation circuit 112, the shield coil control circuit 121, the deflection control circuit 128, etc. may be configured by at least one processing circuit described above.

Embodiments have been explained referring to specific examples described above. However, the present invention is not limited to these specific examples.

While the apparatus configuration, control method, and the like not directly necessary for explaining the present invention are not described, some or all of them can be appropriately selected and used on a case-by-case basis when needed.

In addition, any other electron optical system and multi-beam image acquiring apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. An electron optical system comprising:
   an electromagnetic lens including a yoke and a coil configured to refract an electron beam passing through the yoke by generating a magnetic field; and
   a shield coil disposed such that an inner wall of the yoke separates the shield coil from the coil of the electromagnetic lens, and such that the whole shield coil is surrounded by the inner wall, and configured to reduce a leakage magnetic field generated by the electromagnetic lens, wherein
   the inner wall includes a portion that extends in a direction perpendicular to a surface of a stage, the portion of the inner wall including a cylindrical inner peripheral surface extending in a direction orthogonal to the surface of the stage, the surface of the stage being a surface that the electron beam is directed towards, and
   the shield coil is surrounded by the portion of the inner wall.

2. The electron optical system according to claim 1, wherein the shield coil comprises multiple coils disposed along the inner wall of the yoke in a direction of the passing electron beam.

3. The electron optical system according to claim 2, further comprising a shield coil control circuit configured to independently control each of the multiple coils by supplying an excitation current to each of the multiple coils to reduce the leakage magnetic field generated by the electromagnetic lens.

4. The electron optical system according to claim 1, further comprising:
   an electro-optical equipment at least one portion of which is disposed in the yoke, the electro-optical equipment being configured by structural components including magnetic material.

5. The electron optical system according to claim 4, wherein a primary electron beam and a secondary electron beam pass through the electromagnetic lens, where the secondary electron beam travels in a reverse direction to the primary electron beam, the secondary electron beam being generated as a reflected electron beam, when a substrate is irradiated with the primary electron beam, and
the electron optical system further comprising a beam separator configured to separate the primary electron beam and the secondary electron beam, the beam separator comprising the electro-optical equipment.

6. The electron optical system according to claim 4, wherein a primary electron beam and a secondary electron beam pass through the electromagnetic lens, where the secondary electron beam travels in a reverse direction to the primary electron beam, the secondary electron beam being generated as a reflected electron beam, when a substrate is irradiated with the primary electron beam, and the electron optical system further comprising a deflector configured to deflect the secondary electron beam, the deflector comprising the electro-optical equipment.

7. A multi-electron-beam image acquiring apparatus comprising:

an electromagnetic lens including a yoke and a coil configured to refract primary multiple electron beams passing through the yoke by generating a magnetic field;

a shield coil disposed such that an inner wall of the yoke separates the shield coil from the coil of the electromagnetic lens, and such that the shield coil is surrounded by the inner wall, and configured to reduce a leakage magnetic field generated by the electromagnetic lens;

a beam separator disposed in the yoke, and configured to separate, in the yoke, the primary multiple electron beams and secondary electron beams, the secondary electron beams including reflected electron beams generated when a substrate is irradiated with the primary multiple electron beams having passed through the electromagnetic lens, the beam separator being configured by structural components including magnetic material; and a detector configured to detect the secondary electron beams having been separated.

* * * * *